(12) United States Patent
Brazell et al.

(10) Patent No.: US 6,993,738 B2
(45) Date of Patent: Jan. 31, 2006

(54) METHOD FOR ALLOCATING SPARE CELLS IN AUTO-PLACE-ROUTE BLOCKS

(75) Inventors: Mark Brazell, Cedar Park, TX (US); Alexander Essbaum, Austin, TX (US)

(73) Assignee: IP-First, LLC, Fremont, CA (US)

( * ) Notice: Subject to any disclaimer, the term of this patent is extended or adjusted under 35 U.S.C. 154(b) by 429 days.

(21) Appl. No.: 10/373,989

(22) Filed: Feb. 25, 2003

(65) Prior Publication Data

US 2003/0233625 A1   Dec. 18, 2003

Related U.S. Application Data

(60) Provisional application No. 60/390,026, filed on Jun. 18, 2002.

(51) Int. Cl.
*G06F 17/50* (2006.01)
*G06F 9/45* (2006.01)

(52) U.S. Cl. ............... 716/8; 716/7; 716/9; 716/10
(58) Field of Classification Search ........... 716/7–10
See application file for complete search history.

(56) References Cited

U.S. PATENT DOCUMENTS 5,623,420 A * 4/1997 Yee et al. ............... 716/1
6,093,214 A * 7/2000 Dillon .................... 716/17
6,321,371 B1 * 11/2001 Yount, Jr. ............... 716/17
6,446,248 B1 * 9/2002 Solomon et al. ........ 716/17
6,453,454 B1 * 9/2002 Lee et al. ............... 716/11
2001/0056569 A1 * 12/2001 Komaki .................. 716/10

* cited by examiner

*Primary Examiner*—Stacy A. Whitmore
*Assistant Examiner*—Magid Y. Dimyan
(74) *Attorney, Agent, or Firm*—E. Alan Cavis; James W. Huffman

(57) ABSTRACT

A method for placing spare cells into an auto-place-route (APR) block of an integrated circuit is disclosed. The list of functional cells to be included in the block is determined along with the netlist. The sum of the areas of the functional cells and the desired spare cell area is used as the area of the block boundary. The boundary is provided as input to an auto-placement tool along with the netlist and the list of functional cells. The list of functional cells specifically does not include the spare cells so that the tool does not place spare cells in the boundary. Consequently, the spare cell area may be utilized as wiggle-room by the tool to efficiently place the functional cells. The tool produces a placement of the functional cells that includes white space in the boundary. Spare cells are then placed into the white space.

28 Claims, 3 Drawing Sheets

Spare Cell Allocation Example

*Spare Cell Allocation Method*

*Spare Cell Area Determination Embodiments*

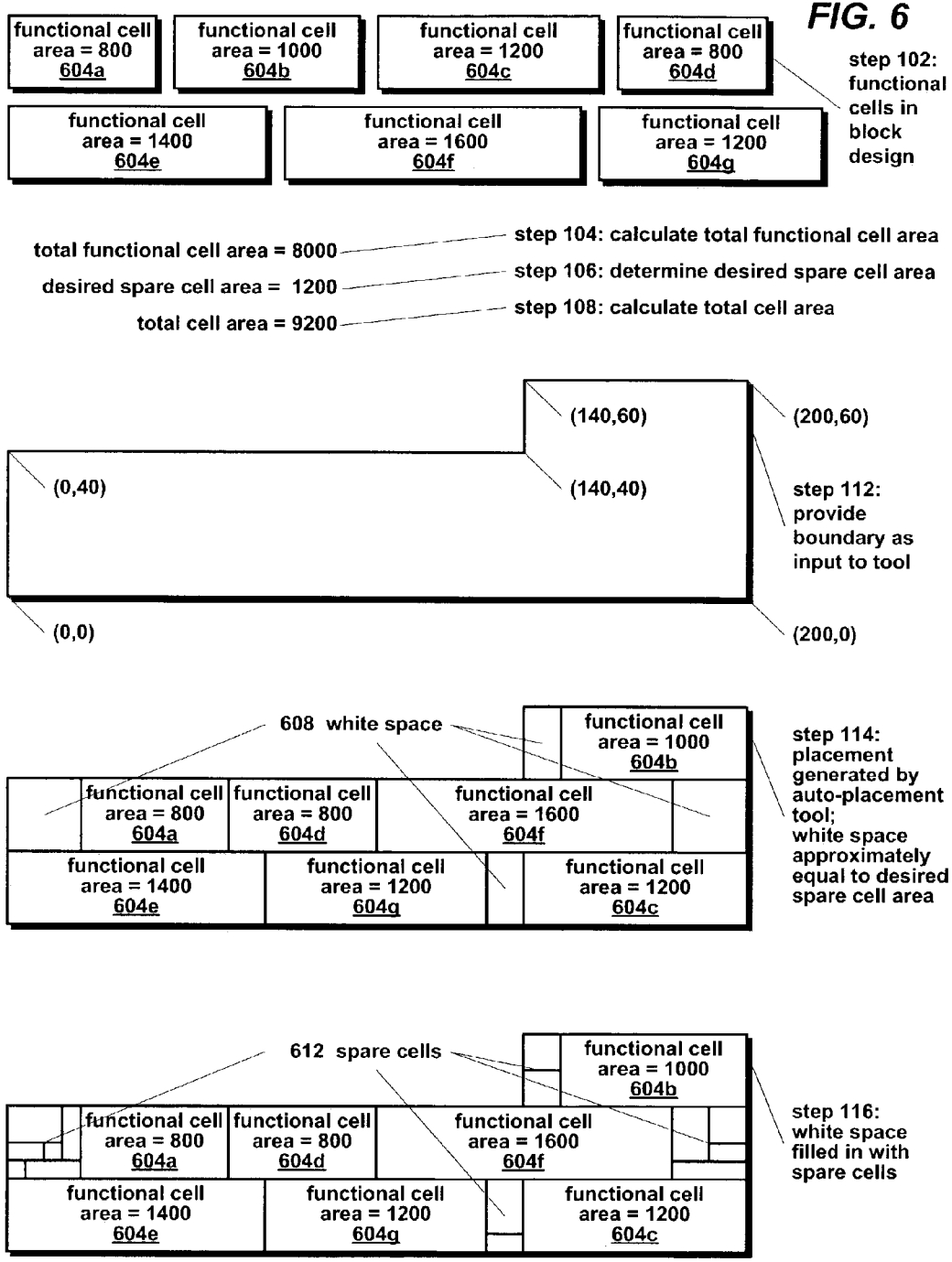

METHOD FOR ALLOCATING SPARE CELLS IN AUTO-PLACE-ROUTE BLOCKS

PRIORITY INFORMATION

This application claims priority based on U.S. Provisional Application, Ser. No. 60/390,026, filed Jun. 18, 2002, entitled SPARE CELL ALLOCATION METHOD FOR AUTO-PLACE-ROUTE BLOCKS.

FIELD OF THE INVENTION

This invention relates in general to the field of methods for automatically placing and routing circuit cells in integrated circuits, and particularly to the allocation of space within the integrated circuits for spare cells.

BACKGROUND OF THE INVENTION

In order to more fully appreciate the invention disclosed herein, it is useful to first explain four concepts relevant to integrated circuit design: the relationship of functional block size to yield, the hierarchical nature of integrated circuit design, the use of auto-place-route (APR) tools, and the use of spare cells to make engineering changes (ECs) to integrated circuit designs.

There exists constant market pressure to reduce the cost of integrated circuits. One large factor in the cost of integrated circuits is the yield. Integrated circuits are manufactured as a two-dimensional array of individual integrated circuit dies on a semiconductor wafer. When the wafer has been processed to form the integrated circuit dies, the wafer is cut up to separate the individual dies. Because wafers have flaws, some percentage of the dies in the array will be non-functional. The yield is the ratio of functional dies to the total dies produced.

One large factor in determining the yield is the size of each individual die on the wafer. This is because the wafer flaws are distributed relatively evenly across the wafer, and a single flaw may be sufficient to render an individual die non-functional. Hence, as the size of the die increases, the probability that a die will have one or more flaws and be non-functional increases. At the extreme, a die so large that it takes up the entire wafer, such that only one die can fit on a wafer, would result in a yield approximating 0%. A large factor in determining the die size is how densely the designers are able to place on the die the constituent circuit elements that make up the integrated circuit design.

When engineers design a complex integrated circuit, such as a microprocessor, they design it using a hierarchical approach. That is, they break the design down into high-level pieces that connect together to form the design. The high-level pieces are further broken down into yet smaller pieces that connect together to form the high-level pieces. This hierarchical breakdown may continue such that there are several levels in the hierarchy. The hierarchical approach has the advantage of making the complexity of the design manageable and achievable. The hierarchical approach also has the advantage of enabling different engineers to design different pieces of the design.

At the highest level, the design is made up of multiple pieces commonly referred to as "functional blocks" that are connected together to form the integrated circuit. For example, a microprocessor is made up of functional blocks such as arithmetic logic units, register files, cache memories, floating-point units, instruction translators, etc. The functional blocks have inputs and outputs that are coupled together to form the microprocessor design.

The functional blocks are themselves made up of multiple smaller pieces commonly referred to as "cells." Examples of cells are logic gates, (e.g., AND, OR, NAND, NOR), flip-flops, multiplexers, registers, comparators, counters, etc. The cells have inputs and outputs that are coupled together to form a functional block. The cells may be standard cells chosen from a library of common cells, or the cells may be custom-designed cells.

When engineers design a block, they typically focus first on which cells need to be included in the block and how the cells in the block will be connected logically, that is, which inputs will be connected to which outputs. Next, they focus on how the included cells will be physically placed within the block and how their inputs and outputs will be connected physically. There are essentially two methods of physically placing the cells within a functional block. One way is for the designers themselves to physically place the cells within the functional block. This type of functional block is commonly referred to as a custom block. An example of a custom block is a high-density memory cell, such as a dynamic random access memory (DRAM) cell.

A second method of physically placing the cells of a functional block is to employ computer-aided design software tools. These tools are commonly referred to as auto-place-route (APR) tools, and functional blocks whose placement is performed by APR tools are commonly referred to as APR blocks. APR tools take as input the list of cells that make up the block (including their physical area and input/output specifications), information that specifies how the cells are to be connected together, and a boundary of the block within which the tool is to place the cells. APR tools attempt to place the cells as densely as possible, while also taking into account the connectivity information for wire routing purposes, and output a physical layout, or placement, of the block and a specification of the physical location of the wires connecting the cell inputs and outputs.

Typically, a user of an APR tool specifies the APR block boundary input such that the area of block is around 5% to 15% more than the sum of the areas of the individual cells that make up the block. The extra area, or "wiggle-room", is necessary because the cells are not uniform in shape. Thus, without wiggle-room, the APR tool would never fit all the cells into the block boundary. In addition, placing the cells may be very complex and require large amounts of time to perform, even running the APR tools on today's powerful computers. The more wiggle-room allotted, the faster the APR tool can place the cells. As a result of the wiggle-room added to the boundary, there will be unused space within the block that is not taken up by cells. This unused space is commonly referred to as "white space," which is wasted space on the die. The more white space within the functional blocks of an integrated circuit, the larger the die size, resulting in lower yields.

Because an integrated circuit product can be very complex, over the product's lifetime it is often necessary to make small changes to its design. These small changes are commonly referred to as an "engineering change" or "EC." Probably the most common cause of an EC is a design flaw or "bug" in the product design that needs to be fixed.

Some ECs may simply require the existing cells to be rewired together in a manner slightly different from the previous design. However, other ECs require new cells to be added and connected in with the existing cells. Knowing this, designers include extra cells, referred to as "spare cells," within a functional block in addition to the necessary cells, referred to as "functional cells." The spare cells are capable of performing the same function as functional cells of the same type, such as logic gates or multiplexers, but the inputs and outputs of the spare cells are not connected to other cells in the block. If new cells are needed subsequently to make an EC, then the spare cells are connected to the original functional cells as needed to make the change.

Including spare cells within functional blocks is particularly advantageous in reducing the time and cost required to make an EC. During the manufacture of a complex integrated circuit, it is not uncommon to perform on the order of 100 process steps that are performed over the course of a few weeks. Each process step adds something toward the creation of the integrated circuit dies on the wafer, such as depositing a microscopically thin layer of semiconductor or metal material. The early stages of the process are the most time-consuming and expensive of the steps. These early steps generally define the location of the individual semiconductor devices, such as transistors, that make up the cells. The later process steps are faster, cheaper, and easier to perform, and generally define the location of the wires that connect the transistors, cells, and functional blocks of the integrated circuit.

Consequently, an EC that requires the addition of new transistors or cells is much more costly than an EC that does not require the addition of new transistors or cells, but merely requires rewiring already existing transistors or cells. Placing spare cells into a functional block can greatly increase the likelihood that an EC will only require rewiring.

One reason an EC that does not require the addition of new transistors or cells is less costly is due to the fact that when the wafers are manufactured with the original design (later found to require changing), some of the wafers that have not yet had the wire definition steps performed on them may be set aside, so that when an EC needs to be made, the wire definition steps of the process may be performed to connect in spare cells as needed. This will result in the production of at least some dies with the EC made so that the EC can be tested before being put into mass production. In this scenario, the spare cells are used in a manner to test out bug fixes in a relatively quick manner analogous to the well-known practice of using "white wires" to fix bugs on a circuit board.

In another scenario, assume it is discovered that an integrated circuit is not functioning properly, and the behavior of the circuit is such that the designers believe there is a design flaw, but do not yet know what the bug is or how to fix it. Immediately, wafers could begin being fabricated through the process steps up to, but not including, the wire definition steps while the designers determine the bug and design a fix for the bug using spare cells. Once the bug fix is designed, the final wire definition steps of the process may be performed to connect in the spare cells as needed. This course of action can result in the saving of perhaps two or three weeks, which may be extremely valuable in terms of avoiding lost revenue, particularly in an industry where time-to-market is critical.

Currently, APR block designers determine the block boundary area to provide as input to an APR tool by adding the total functional cell area (i.e., the sum of the areas of the individual functional cells in the block), the area needed for spare cells (typically about 5%–15% of the total functional cell area), and the area needed for wiggle-room to enable the APR tool to effectively place the cells (typically about 5%–15% of the sum of the total functional cell area and the spare cell area).

The disadvantage of the conventional method is that it generates relatively large amounts of white space within APR blocks, namely the wiggle-room area, which results in larger die sizes, which in turn results in lower yields than a completely efficiently placed integrated circuit. Therefore, what is needed is a method for reducing the white space in integrated circuit APR blocks.

SUMMARY

The present invention recognizes the synergistic relationship between the fact that the amount of white space generated by APR tools due to wiggle-room and the amount of APR block area allocated to spare cells is typically close, and the fact that spare cells typically can be physically placed anywhere within an APR block and serve their purpose in the making of an EC. The present invention provides a method for placing spare cells within APR blocks that greatly reduces the amount of white space within the blocks to essentially minimize the white space by not including wiggle-room area in the block boundary area, leaving the spare cells out of the cell list provided to the APR tool, which results in the tool generating an amount of white space approximately equal to the desired spare cell area, and placing the spare cells into the white space generated by the APR tool block placement. Accordingly, in attainment of the aforementioned object, it is a feature of the present invention to provide a method for allocating spare cells in an auto-place-route (APR) block. The method includes calculating a total area of a list of functional cells and a list of spare cells to be included in the APR block. The method also includes providing the list of functional cells and a boundary as input to an auto-placement tool to generate a layout of the APR block based thereon. The list of functional cells excludes the list of spare cells. The boundary has an area approximately equal to the total area of the list of functional cells and the list of spare cells. The method also includes substantially filling white space in the layout with spare cells from the list of spare cells.

In another aspect, it is a feature of the present invention to provide a method for placing cells within an auto-place-route (APR) block in an integrated circuit. The APR block design includes a functional cell list specifying a plurality of functional cells to be included therein. Each of the plurality of functional cells has an area and inputs and outputs. The APR block design also includes connectivity information specifying how the inputs and outputs of the plurality of functional cells is to be connected. The method includes determining a spare cell area, determining a boundary of the APR block having an area approximately equal to a sum of the spare cell area and the plurality of functional cell areas, and providing to an APR software program the functional cell list, the connectivity information, and the boundary. The APR program generates a layout of the APR block having empty space within the boundary. The method also includes placing spare cells into the empty space after the APR program generates the layout of the APR block.

In another aspect, it is a feature of the present invention to provide a method for placing cells within a functional block of an integrated circuit. The method includes determining a list of cells to be included in the functional block. The list excludes spare cells. The method also includes determining a boundary of the functional block. The boundary has an area which is a function of a sum of areas of the list of cells. The method also includes generating a physical placement of the list of cells within the boundary. The physical placement is generated by auto-placement software. The auto-placement software receives a specification of the boundary and the list of cells. The method also includes placing spare cells into white space within the boundary after generating the physical placement. The white space is a result of the auto-placement software physical placement of the list of cells.

An advantage of the present invention is that it leaves essentially no white space in the blocks, resulting in smaller blocks than the previous method. The smaller blocks have the advantages of smaller final die size, resulting in higher yields and reduced cost. Additionally, smaller blocks mean the blocks are closer together on the die, which potentially reduces the lengths of signal paths on the die, which reduces propagation delays and critical signal timing, resulting in the ability to increase integrated circuit clock frequency, such as in a microprocessor. Also, the present invention potentially reduces the time required to automatically place and route the cells within a block.

Other features and advantages of the present invention will become apparent upon study of the remaining portions of the specification and drawings.

BRIEF DESCRIPTION OF THE DRAWINGS

FIG. 6 is a block diagram illustrating an example of spare cell allocation according to FIG. 1 of the present invention.

DETAILED DESCRIPTION

Figure 1:
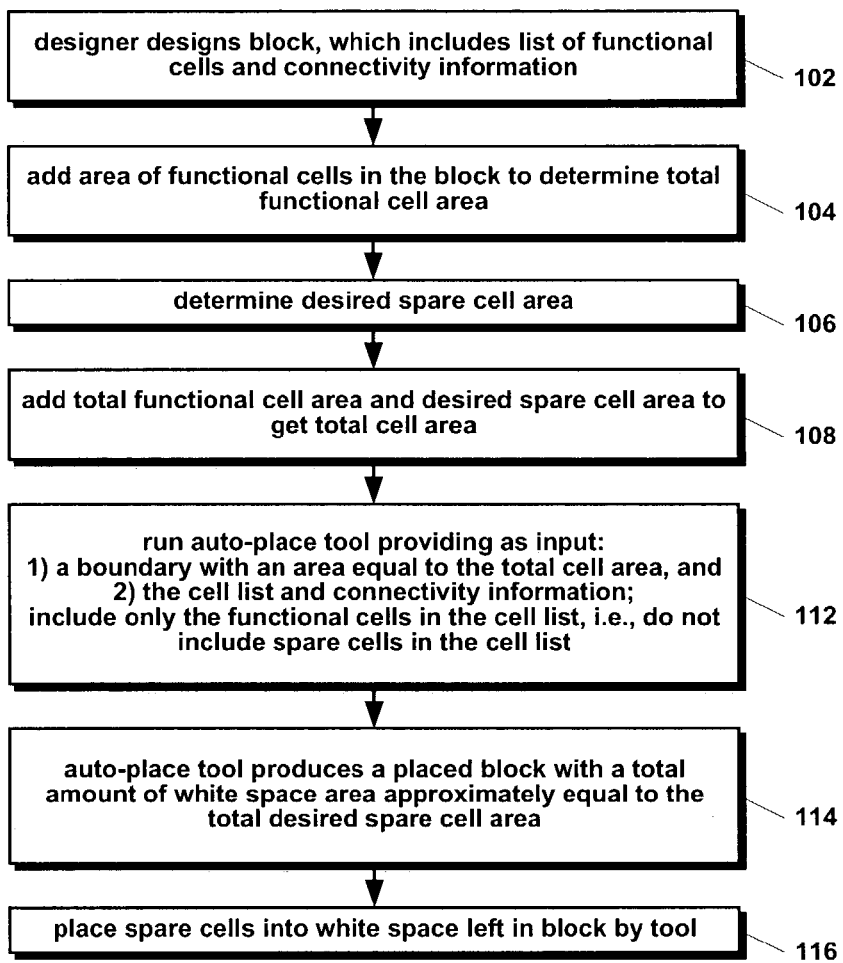
FIG. 1 is a flowchart illustrating a method for allocating spare cells within an APR block according to the present invention.

Referring now to FIG. 1, a flowchart illustrating a method for allocating spare cells within an APR block according to the present invention is shown. Flow begins at step 102.

At step 102, a designer designs an APR block to be used in an integrated circuit design, such as a microprocessor. An APR block is a functional block within an integrated circuit whose functional cells are physically placed and routed in the block by an auto-place-route (APR) software program, or tool. Examples of an APR block are an arithmetic logic unit (ALU) or floating point unit (FPU) or MMX unit (MXU) (any of which might be further sub-dividable into N-bit adders, multipliers, etc.), a translation look-aside buffer (TLB), a bus interface unit (BIU), a register file, an instruction translator, an instruction queue, write, fill, or store buffers, and various control logic blocks for various elements, such as data, instruction, or branch target address cache memories. Examples of well-known APR tools include TeraPlace, by Mentor Graphics Corp.; Physical Compiler, by Synopsys, Inc.; and Silicon Ensemble, by Cadence Design Systems, Inc.

A cell is a circuit that performs a function, and the circuit has a specific, unchanging physical boundary such that if the physical boundary of the cell changes, then by definition the cell is no longer the same cell. A block is a collection of cells within a physical boundary such that if the collection of functional cells changes, then by definition the block is no longer the same block; however, the physical boundary of a block may change and the block will still be functionally the same as long as the collection of functional cells remains the same, in contrast to a cell, in which the physical boundary may not change. Consequently, two different auto-placement tools might generate different locations for the collection of functional cells within the boundary specified for an APR block.

Another means of distinguishing cells from blocks in the APR context is that blocks have a physical hierarchy, whereas cells do not have a physical hierarchy. An auto-place-route (APR) block is also referred to as a random logic macro (RLM). It should be noted that non-APR blocks, such as custom blocks, may not have a hierarchy. For example, a custom block such as a DRAM block may be custom designed such that the designer physically places the individual elements of the circuit, such as the transistors or logic gates, rather than allowing an auto-placement tool to place the circuit elements.

The APR block design of step 102 includes a list of functional cells to be included in the APR block. A functional cell is a cell whose inputs and outputs are connected to other cells in the block to perform the function of the block. Functional cells are contrasted with spare cells, which are capable of performing the same function as functional cells of the same type, but the inputs and outputs of the spare cells are not connected to other cells in the block according to the design of the block. Spare cells are included in the block for the purpose of making a subsequent engineering change (EC), such as to fix a bug or to make an enhancement in the integrated circuit. Examples of types of functional cells are logic gates (e.g., AND, OR, NAND, NOR, XOR, etc.), transistors, latches, flip-flops, multiplexers, demultiplexers, registers, comparators, carry save adders, counters, shift registers, priority encoders, clock regenerators, dual-phase buffers, and synchronizers.

The APR block design of step 102 also includes connectivity information. The connectivity information is information that describes how the inputs and outputs of the functional cells are to be connected together. A netlist is an example of the connectivity information. For example, the connectivity information might specify that the output pin of inverter XYZ is to be connected to input 1 of NAND-gate ABC and the output pin of NAND-gate ABC is to be connected to input 3 of NOR-gate GHI. The auto-placement tool takes the connectivity information into account when it places the cells in the APR block in order to make the subsequent routing step easier. Flow proceeds from step 102 to step 104.

At step 104, the designer adds the area of each of the functional cells in the APR block design specified at step 102 to determine the total functional cell area. Typically, the shape of a cell is a rectangle. In particular, spare cells that the designer may desire to be eventually included in the APR block are not taken into account when determining the total functional cell area. Flow proceeds from step 104 to step 106.

At step 106, the designer determines the desired amount of area to be devoted to spare cells within the APR block. The designer may determine the desired spare cell area by various means. FIGS. 2 through 5 describe four ways contemplated for determining the spare cell area. Flow proceeds from step 106 to step 108.

At step 108, the designer adds the total functional cell area determined at step 104 to the desired spare cell area determined at step 106 to obtain the total cell area for the APR block. As described below with respect to step 112, the total cell area is used to approximate the APR block boundary area. In particular, the total cell area approximating the APR block boundary area does not make any substantial allowance for wiggle-room, unlike in the conventional method. Rather, as will be seen below, the spare cell area determined at step 106 serves as the wiggle-room since the spare cells are not included in the cell list provided to the APR tool, unlike in the conventional method. Flow proceeds from step 108 to step 112.

At step 112, an APR tool is run to place the functional cells included in the functional cell list at step 102 in the APR block. At least two inputs are provided to the APR tool: the functional cell list and connectivity information generated at step 102, and a boundary for the APR block. In particular, the functional cell list does not include spare cells. Consequently, the tool places no spare cells into the specified boundary. The spare cell area determined at step 106, which is included in the total cell area determined at step 108, but not used by the tool to place spare cells since the spare cells are not included in the functional cell list input to the tool, advantageously serves as wiggle-room, which enables the tool to place the functional cells into the specified APR block boundary more easily.

The APR block boundary is a set of coordinates specifying the vertices of a polygon into which the functional block is to be placed. The vertices of the polygon necessarily define an area, which is approximately the total cell area determined at step 108. In one embodiment, all angles of the polygon are right angles. The designer typically chooses the shape of the functional block boundary polygon to fit the APR block optimally into the overall floorplan of the integrated circuit. Flow proceeds from step 112 to step 114.

At step 114, the auto-placement tool produces a placement, or layout, of the functional cells specified at step 112 into the boundary specified at step 112. The placement necessarily includes white space, i.e., unused space in the APR block boundary not occupied by functional cells, since the total functional cell area is less than the boundary area. The white space is typically composed of many separate white spaces, referred to collectively as white space. The sum of the areas of the separate white spaces, i.e., the total white space area, necessarily approximates the total desired spare cell area determined at step 106. Flow proceeds from step 114 to step 116.

At step 116, the designers place spare cells into the white space left in the APR block by the tool. Larger spare cells are placed into larger individual white spaces, medium spare cells are placed into medium individual white spaces, and so forth, until all that remains is small individual white spaces for small spare cells, such as logic gates and transistors. In this manner, the white space is essentially eliminated and near complete efficiency is achieved in utilization of the APR block area. The spare cells may be placed into the white space by any of various means. The designer may hand place the spare cells into the white space using visual computer-aided-design (CAD) tools. Alternatively, a software tool receives as input the list of spare cells to be placed into the APR block and the placement output of the auto-placement tool of step 114, and automatically places the spare cells into the white space in the APR block. Flow ends at step 116.

Figure 2:
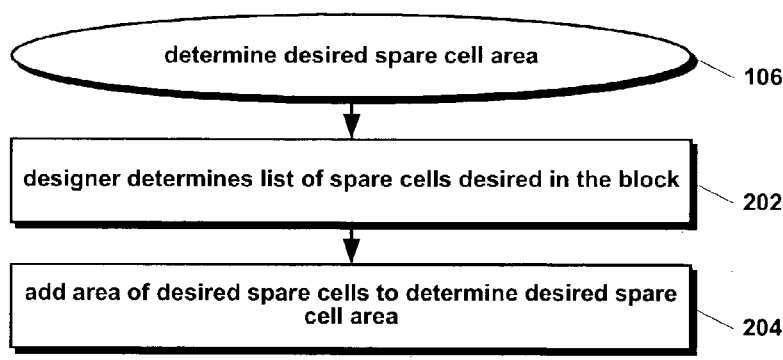
FIGS. 2 through 5 are flowcharts illustrating four embodiments of the step of determining the desired spare cell area of FIG. 1.

Referring now to FIG. 2, a flowchart illustrating a first embodiment of the step of determining the desired spare cell area of step 106 of FIG. 1 is shown. Flow begins at step 202.

At step 202, the designer determines the list of spare cells desired to be included in the APR block. Typically, the designer selects types and quantities of the spare cells based on the function of the APR block. Large numbers of logic gates, for example, are commonly included in the spare cell list. Flow proceeds to step 204.

At step 204, the designer adds the areas of the individual spare cells in the spare cell list determined at step 202 to determine the desired spare cell area of step 106. Flow ends at step 204.

Figure 3:
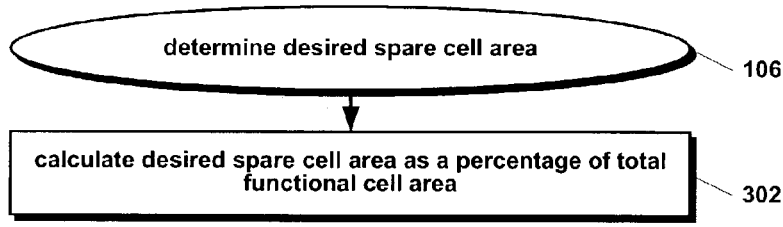

Referring now to FIG. 3, a flowchart illustrating a second embodiment of the step of determining the desired spare cell area of step 106 of FIG. 1 is shown. Flow begins at step 302.

At step 302, the designer calculates the desired spare cell area for step 106 as a percentage of the total functional cell area determined at step 104 of FIG. 1. For example, the designer might calculate the desired spare cell area as 10% of the total functional cell area. The percentage may vary as a function of the complexity and/or size of the APR block. Flow ends at step 302.

Figure 4:
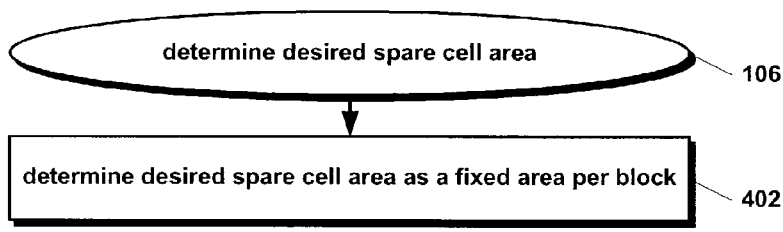

Referring now to FIG. 4, a flowchart illustrating a third embodiment of the step of determining the desired spare cell area of step 106 of FIG. 1 is shown. Flow begins at step 402.

At step 402, the designer calculates the desired spare cell area for step 106 as a fixed area used as the spare cell area for all blocks in the integrated circuit design. For example, the design might fix the desired spare cell area at 500 square microns. Flow ends at step 402.

Figure 5:
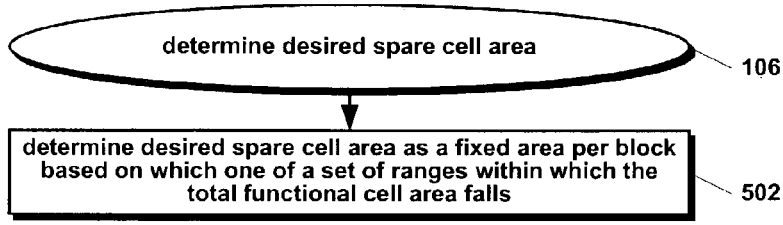

Referring now to FIG. 5, a flowchart illustrating a fourth embodiment of the step of determining the desired spare cell area of step 106 of FIG. 1 is shown. Flow begins at step 502.

At step 502, the designer calculates the desired spare cell area for step 106 as a fixed area based on a range in which the total functional cell area determined at step 104 falls. That is, the integrated circuit designers determine multiple ranges of total functional cell area, and assign a fixed spare cell area for each of the multiple ranges. For example, the design might fix the desired spare cell area at 500 square microns for a total functional cell area less than 4,500 square microns; 600 square microns for a total functional cell area between 4,500 and 6,000 square microns; 800 square microns for a total functional cell area between 6,000 and 8,000 square microns; and 1,000 square microns for a total functional cell area greater than 8,000 square microns. Flow ends at step 502.

Referring now to FIG. 6, a block diagram illustrating a scaled drawing of an example of spare cell allocation according to FIG. 1 of the present invention is shown. The example of FIG. 6 is greatly simplified to include only seven functional cells for illustration purposes; whereas, a typical APR block may include hundreds of functional cells. Consequently, the functional cells in the example are proportionately larger relative to the total block area than would normally be the case.

As shown in FIG. 6, seven functional cells, denoted 604a through 604g, referred to collectively as functional cells 604, are included in the example APR block design according to step 102 of FIG. 1. Functional cells 604a through 604g have areas of 800, 1000, 1200, 800, 1400, 1600, and 1200 square microns, respectively. In addition to the area of each of the functional cells 604, the design also includes the input and output specifications of each of the functional cells 604 and the connectivity information describing how the various inputs and outputs are to be connected to perform the function of the APR block.

As shown in FIG. 6, the areas of the functional cells 604 are added together to yield a total functional cell area of 8000 square microns, according to step 104 of FIG. 1. As shown in FIG. 6, the desired spare cell area is determined to be 1200 in the example, according to step 106 of FIG. 1. As shown in FIG. 6, the total cell area is determined to be 9200 square microns by adding the total functional cell area to the desired spare cell area, according to step 108.

As shown in FIG. 6, an APR block boundary 606 is determined for providing as input to an APR tool, according to step 112 of FIG. 1. The boundary 606 of the APR block is a polygon which is specified by coordinates for each of the vertices of the polygon 606, as shown. The area of the polygon 606 is 9200 square microns, which is the total cell area determined at step 108. Also at step 112, the list of the functional cells 604 is provided to the auto-placement tool along with the connectivity information. In particular, spare cells are not included in the list of functional cells 604 provided to the tool.

As shown in FIG. 6, the auto-placement tool generates a placement of the APR block based on the block boundary 606, list of functional cells 604, and connectivity information, according to step 114 of FIG. 1. The placement yields white space 608, as shown. FIG. 6 shows four distinct white spaces 608 in the placement of the block. As shown, the total area of the individual white spaces 608 is approximately equal to the desired spare cell area, 1200 square microns, determined at step 106.

As shown in FIG. 6, spare cells are placed in the white space 608 generated at step 114, according to step 116 of FIG. 1. Advantageously, essentially the entire white space 608 is filled in with spare cells, resulting in near completely efficient placement of the APR block, resulting in substantially no wasted space with its accompanying benefits. As stated above, because the example uses a much smaller number of functional cells 604 than normal, the functional cells 604 are disproportionately large, and in particular may be disproportionately larger than the spare cells shown.

Although the present invention and its objects, features, and advantages have been described in detail, other embodiments are encompassed by the invention. For example, although various embodiments have been described to determine the spare cell area, the invention is adaptable to use any method of determining the spare cell area. Furthermore, although various steps of the present invention are described as being performed by an integrated circuit designer, the steps may be performed by the designer with the aid of a computer system.

Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A method for allocating spare cells in an auto-place-route (APR) block, comprising:
    calculating a total area of a list of functional cells and a list of spare cells to be included in the APR block;
    providing said list of functional cells and a boundary as input to an auto-placement tool to generate a layout of the APR block based thereon, wherein said list of functional cells excludes said list of spare cells, wherein said boundary has an area approximately equal to said total area of said list of functional cells and said list of spare cells; and
    substantially filling white space in said layout with spare cells from said list of spare cells.

2. The method of claim 1, wherein said white space comprises space within said boundary not occupied by said list of functional cells.

3. The method of claim 1, wherein said spare cells comprise cells whose inputs and outputs are not coupled to other cells in the APR block.

4. The method of claim 1, wherein said functional cells comprise cells whose inputs and outputs are coupled to other cells in the APR block.

5. The method of claim 1, wherein said functional cells comprise cells necessary for the APR block to perform its intended function.

6. The method of claim 1, wherein said boundary comprises a polygon.

7. The method of claim 6, wherein said providing said boundary to said auto-placement tool comprises providing coordinates of said polygon.

8. The method of claim 1, further comprising:
    providing connectivity information for said list of functional cells as input to said auto-placement tool to generate said layout of the APR block based thereon, in addition to providing said list of functional cells and said boundary.

9. A method for placing cells within an auto-place-route (APR) block in an integrated circuit, the APR block design including a functional cell list specifying a plurality of functional cells to be included therein, each of the plurality of functional cells having an area and inputs and outputs, the APR block design also including connectivity information specifying how said inputs and outputs of said plurality of functional cells is to be connected, the method comprising:
    determining a spare cell area;
    determining a boundary of the APR block having an area approximately equal to a sum of said spare cell area and the plurality of functional cell areas;
    providing to an APR software program the functional cell list, the connectivity information, and said boundary, wherein said APR program generates a layout of the APR block having empty space within said boundary; and
    placing spare cells into said empty space after said APR program generates said layout of the APR block.

10. The method of claim 9, wherein said functional cell list does not include said spare cells.

11. The method of claim 9, wherein said empty space has a total area approximately equal to said spare cell area.

12. The method of claim 9, wherein said placing said spare cells into said empty space comprises a human placing each of said spare cells into said empty space with the aid of a computer system.

13. The method of claim 9, wherein said placing said spare cells into said empty space comprises providing said layout and a list of desired spare cells to a computer program that automatically places said spare cells into said empty space.

14. The method of claim 9, wherein said placing spare cells into said empty space after said APR program generates said layout of the APR block comprises placing spare cells in substantially all of said empty space.

15. The method of claim 9, wherein said determining said spare cell area comprises:
    determining a list of spare cells desired to be included in the APR block; and
    assigning said spare cell area to approximately a sum of areas of said list of spare cells.

16. The method of claim 9, wherein said determining said spare cell area comprises calculating said spare cell area as a percentage of a sum of said plurality of functional cell areas.

17. The method of claim 16, wherein said percentage is within a range of 5% to 15%.

18. The method of claim 9, wherein said determining said spare cell area comprises assigning said spare cell area to a predetermined value.

19. The method of claim 18, wherein said predetermined value is within a range of 300 square microns to 2,000 square microns.

20. The method of claim 9, wherein said determining said spare cell area comprises assigning said spare cell area to one of a plurality of predetermined values, wherein said plurality of predetermined values is associated with a corresponding plurality of area ranges, wherein said one of said plurality of predetermined values is selected based on which of said corresponding plurality of area ranges a sum of said plurality of functional cell areas falls within.

21. A method for placing cells within a functional block of an integrated circuit, comprising:
   determining a list of functional cells to be included in the functional block, said list excluding spare cells;
   determining a first area value for placing spare cells within the functional block;
   determining a boundary of the functional block, said boundary having a second area value, said second area value comprising a sum of said first area value and a sum of areas of said list of functional cells;
   generating a physical placement of said list of functional cells within said boundary, wherein said physical placement is generated by auto-placement software, said auto-placement software receiving a specification of said boundary and said list of functional cells; and
   placing spare cells into white space within said boundary after said generating said physical placement, wherein said white space is a result of said auto-placement software physical placement of said list of functional cells.

22. The method of claim 21, wherein said white space comprises unused spaces in said boundary.

23. The method of claim 21, wherein said list of functional cells comprises cells required for the functional block to perform its function.

24. The method of claim 21, wherein said spare cells placed into said white space comprise cells not connected to other cells in the functional block.

25. The method of claim 21, wherein the functional block has a physical hierarchy.

26. The method of claim 21, wherein said functional cells do not have a physical hierarchy.

27. The method of claim 21, wherein the functional block is defined by said list of cells to be included in the functional block excluding spare cells.

28. The method of claim 21, wherein said functional cells are defined by an unchanging physical boundary.

* * * * *